(12) United States Patent
Stefanoski et al.

(10) Patent No.: US 12,328,843 B2
(45) Date of Patent: Jun. 10, 2025

(54) HYBRID HEAT SPREADING AND HEATING OF A COMPUTING SYSTEM IN AN AUTONOMOUS VEHICLE

(71) Applicant: GM Cruise Holdings LLC, San Francisco, CA (US)

(72) Inventors: Zoran Stefanoski, San Francisco, CA (US); Gilberto Madrid Gomez, Palo Alto, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 434 days.

(21) Appl. No.: 17/865,743

(22) Filed: Jul. 15, 2022

(65) Prior Publication Data

US 2024/0023278 A1 Jan. 18, 2024

(51) Int. Cl.
*H05K 7/20* (2006.01)
*H05B 3/22* (2006.01)
*H05K 1/02* (2006.01)

(52) U.S. Cl.
CPC .......... *H05K 7/20281* (2013.01); *H05B 3/22* (2013.01); *H05K 1/0203* (2013.01); *H05K 7/20254* (2013.01)

(58) Field of Classification Search
CPC ............. H05K 7/20281; H05K 1/0203; H05K 7/20254; H05K 7/20881; H05B 3/22; H05B 2203/013; H05B 3/34
USPC ....................................................... 165/202
See application file for complete search history.

(56) References Cited

U.S. PATENT DOCUMENTS

2020/0367383 A1* 11/2020 Moon ................ H05K 7/20336
2020/0413570 A1* 12/2020 Kuroiwa ............ H05K 7/20463

* cited by examiner

*Primary Examiner* — Steve S Tanenbaum
(74) *Attorney, Agent, or Firm* — CANTOR COLBURN LLP

(57) ABSTRACT

Examples of the present disclosure provide an apparatus for hybrid heat spreading and heating, comprising: a heating element and a heat exchanger proximate to the heating element, wherein the apparatus is configured to be thermally coupled to an IC device that is configured to operate above a minimum operating temperature. The heating element is configured to: power on when the ambient temperature is below the minimum operating temperature and the IC device is not powered on and power off after the IC device is powered on. The heat exchanger is configured to conduct heat from the heating element to the IC device when the heater is powered on, such that the IC device is heated to a temperature above the minimum operating temperature and conduct heat away from the IC device when the IC device is powered on.

8 Claims, 11 Drawing Sheets

//HYBRID HEAT SPREADING AND HEATING OF A COMPUTING SYSTEM IN AN AUTONOMOUS VEHICLE

BACKGROUND

1. Technical Field

The present disclosure generally relates to heat transfer systems and, more specifically, hybrid heat spreading and heating of a computing system in an autonomous vehicle.

2. Introduction

An autonomous vehicle is a motorized vehicle that can navigate without a human driver. An exemplary autonomous vehicle can include various sensors, such as a camera sensor, a light detection and ranging (LIDAR) sensor, and a radio detection and ranging (RADAR) sensor, among others. The sensors collect data and measurements that the autonomous vehicle can use for operations such as navigation. The sensors can provide the data and measurements to an internal computing system of the autonomous vehicle, which can use the data and measurements to control a mechanical system of the autonomous vehicle, such as a vehicle propulsion system, a braking system, or a steering system. Typically, the sensors are mounted at fixed locations on the autonomous vehicles.

BRIEF DESCRIPTION OF THE DRAWINGS

The various advantages and features of the present technology will become apparent by reference to specific implementations illustrated in the appended drawings. To facilitate this description, like reference numerals designate like structural elements. A person of ordinary skill in the art will understand that these drawings only show some examples of the present technology and would not limit the scope of the present technology to these examples. Furthermore, the skilled artisan will appreciate the principles of the present technology as described and explained with additional specificity and detail through the use of the accompanying drawings in which.

DETAILED DESCRIPTION

Figure 1:
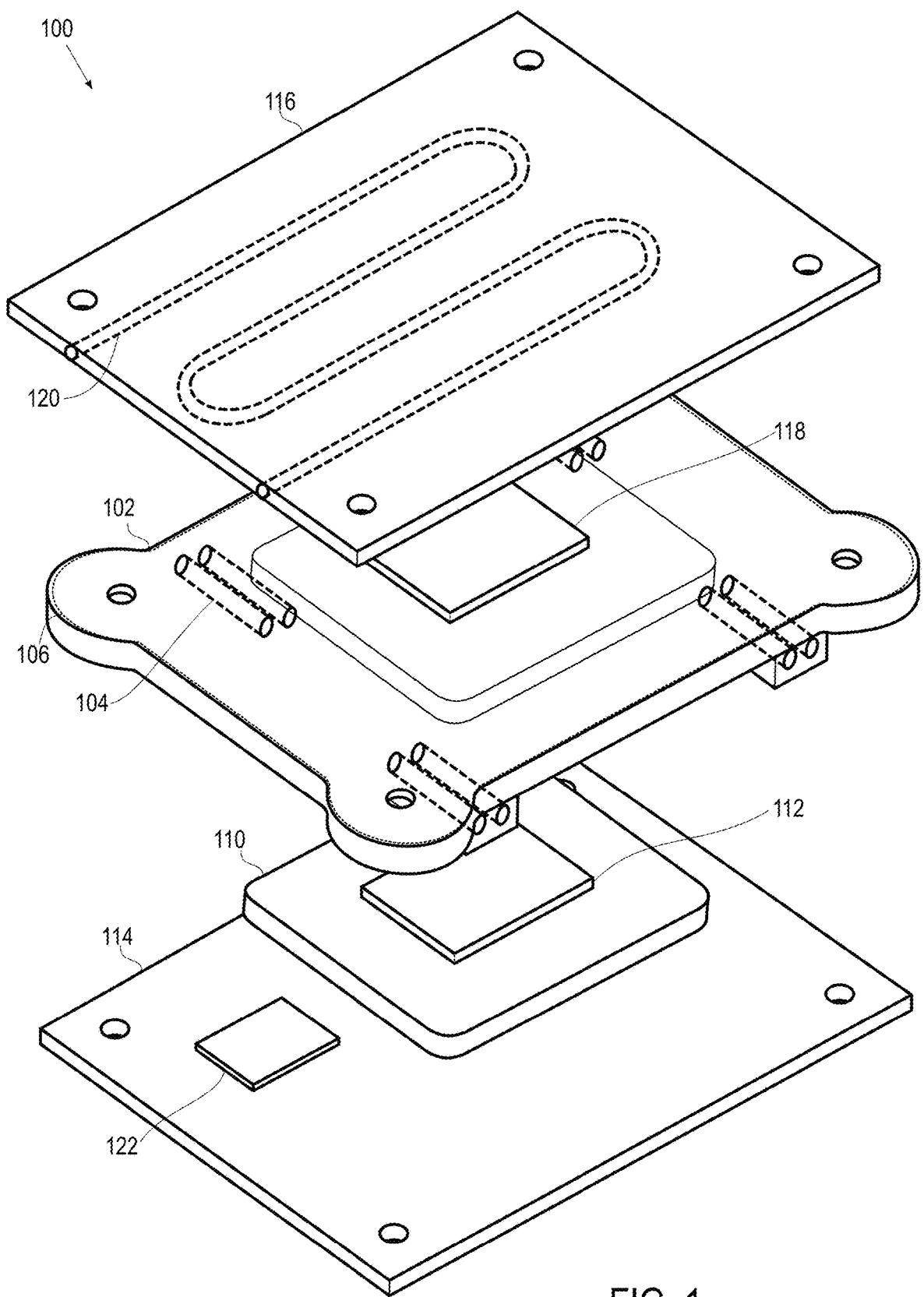
FIG. 1 illustrates a simplified exploded perspective view of an example system for hybrid heat spreading and heat transfer in an autonomous vehicle, according to some examples of the present disclosure.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form in order to avoid obscuring the concepts of the subject technology.

An AV contains within it many integrated circuit (IC) devices such as microprocessors, microcontrollers, and the like. These IC devices perform various functions that serve to allow the AV to operate without a human driver or with little human assistance. Due to various technological factors beyond the scope of this disclosure, many of these IC devices are configured to operate effectively and reliably only under specific temperature conditions, such as above 0° C. Operating below 0° C. can potentially risk thermomechanical failures in these IC devices. Thus, unlike computing devices inside climate-controlled datacenters and homes, due to the manner in which typical vehicles are used, for example, parked outside exposed to the elements in all weather conditions, IC devices inside these vehicles may experience extreme temperatures far below 0° C. for substantial periods of time. In some geographical locations such as Alaska, Finland, etc. within the Arctic Circle, temperatures during winter months can dip below −50° C. on some nights and may stay below 0° C. continuously for days. IC devices in such vehicles under such environmental conditions may fail if the IC devices have to power on several times and/or for several days at such cold temperatures.

Some solutions to this problem involve attaching a temporary heater to the IC device to elevate the temperature of the IC device above 0° C. before powering it on. However, as soon as the IC device is powered on, it generates heat that must be removed effectively to prevent catastrophic failure. Indeed, microprocessors and other such IC devices that perform complex computations may heat up at such a high rate that they have to be cooled using liquid coolants to prevent thermomechanical failure. Thus, the temporary heaters used in those solutions must not only stop heating the IC device once the IC device is powered on, it would be desirable to remove the temporary heater from the heat transfer path of the IC device to prevent thermal failure.

Accordingly, examples of the present disclosure provide an apparatus for hybrid heat spreading and heating, comprising: a heating element and a heat exchanger proximate to the heating element, in which the apparatus is configured to be thermally coupled to an IC device that is configured to operate above a minimum operating temperature (e.g., 0° C.). The heating element is configured to: power on when the ambient temperature is below the minimum operating temperature and the IC device is not powered on, and power off after the IC device is powered on. The heat exchanger is configured to conduct heat from the heating element to the IC device when the heater is powered on, such that the IC device is heated to a temperature above the minimum operating temperature and conduct heat away from the IC device when the IC device is powered on and generating heat.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life manufacturing limitations which may cause the features to not look so "ideal" when any of the structures described herein are examined minutely. Note that in the figures, various components are shown as aligned merely for ease of illustration; in actuality, some or all of them may be misaligned. Further, the figures are intended to show relative arrangements of the components within their assemblies, and, in general, such assemblies may include other components that are not illustrated (e.g., various other components related to electrical functionality, or thermal mitigation). For example, in some further examples, the assembly as shown in the figures may include more electrical or thermomechanical components. Additionally, although some components of the assemblies are illustrated in the figures as being planar rectangles or formed of rectangular solids, this is simply for ease of illustration, and examples of these assemblies may be curved, rounded, or otherwise irregularly shaped as dictated by and sometimes inevitable due to the manufacturing processes used to make various components.

Figure 10:
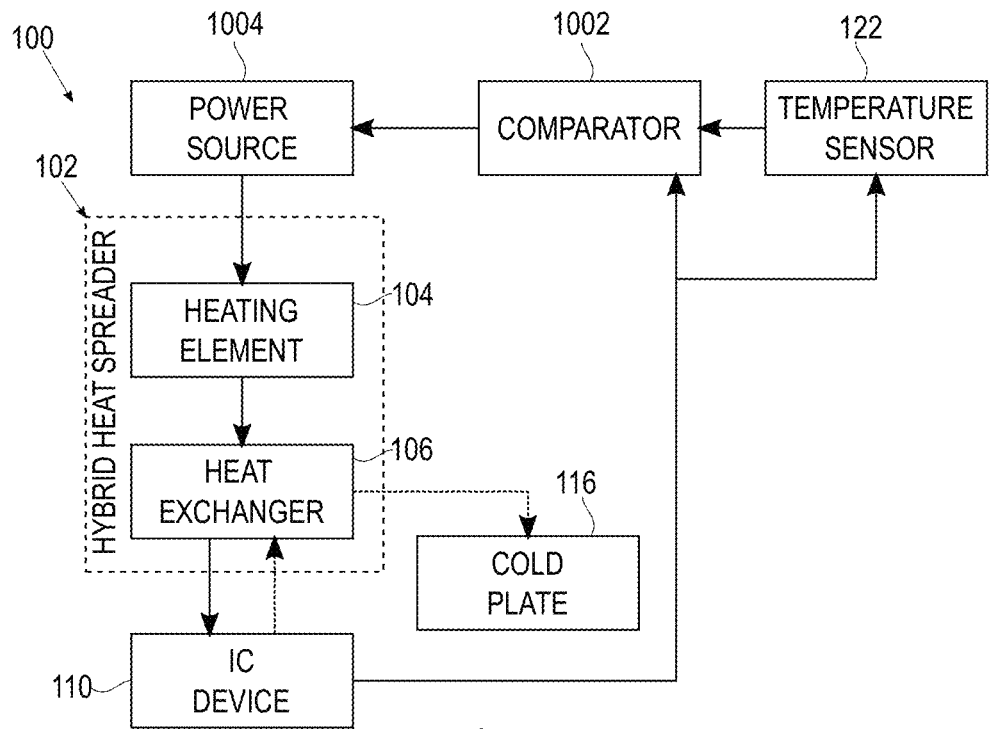
FIG. 10 is a simplified block diagram illustrating an example system for hybrid heat spreading and heat transfer in an autonomous vehicle, according to some examples of the present disclosure.

For convenience, if a collection of drawings designated with different letters are present (e.g., FIGS. 10A-0C), such a collection may be referred to herein without the letters (e.g., as "FIG. 10"). Similarly, if a collection of reference numerals designated with different letters are present (e.g., 112a-112e), such a collection may be referred to herein without the letters (e.g., as "112").

FIG. 1 illustrates a simplified exploded perspective view of an example system 100 for hybrid heat spreading and heat transfer in an AV, according to some examples of the present disclosure. A hybrid heat spreader 102 comprises a heating element 104 and a heat exchanger 106 proximate to heating element 104. Heating element 104 shown in the figure is a cylindrical cartridge type merely for example purposes. Other types of heating elements may be used as described further within the broad scope of the examples described herein. Any appropriate number of heating elements 104 may be included in hybrid heat spreader 102, for example, based on the type of heating element 104, size of hybrid heat spreader 102, and other such factors. Heat exchanger 106 shown by dotted lines is merely symbolic; any suitable type of heat exchanger that can fit within hybrid heat spreader 102 as described further with reference to other figures may be used without departing from the scope of the examples described herein.

Hybrid heat spreader 102 is configured to be thermally coupled to an IC device 110. In some examples (as shown), hybrid heat spreader 102 is thermally coupled to IC device 110 by a thermally conductive material 112. In some examples, thermally conductive material 112 may have adhesive properties. In some examples, thermally conductive material 112 may be soft (e.g., flexible) and compliant. Examples of thermally conductive material 112 include synthetic resins augmented with metallic or inorganic filler materials. In the figure, thermally conductive material 112 is shown as extending partially across a contact area between IC device 110 and hybrid heat spreader 102 merely as an example and not as a limitation. Thermally conductive material 112 may substantially cover the contact area between IC device 110 and hybrid heat spreader 102 in some examples. Other means of attachment, including brazing, soldering, etc. that provides a thermal path between IC device 110 and hybrid heat spreader 102 may also be used within the broad scope of the examples.

In many examples, IC device 110 is configured to operate between a minimum operating temperature (e.g., 0° C.) and a maximum operating temperature (e.g., 100° C.), with an optimum load temperature range (e.g., between 55° C. and 75° C.). Below the minimum operating temperature, IC device 110 may experience reliability issues, such as catastrophic failure, accelerated wear and tear, etc., for example, resulting in not starting up, not powering on, or otherwise not operating as intended; above the maximum operating temperature, IC device 110 may experience catastrophic failure, including melting, cracking, and breaking apart.

In many examples, IC device 110 is conductively and mechanically coupled to a printed circuit board (PCB) 114 (also known as a motherboard). PCB 114 may comprise various other components not shown in the figure so as not to clutter the drawings. In some examples, IC device 110 is coupled to PCB 114 by solder bonds (not shown) such as ball grid array, land grid array, etc. IC device 110 may be sandwiched between PCB 114 and hybrid heat spreader 102. Hybrid heat spreader 102 may be thermally coupled to a cold-plate 116. In various example, cold-plate 116 is made from a thermally conductive material, such as aluminum, steel, copper, etc. In some examples (as shown), hybrid heat spreader 102 is thermally coupled to cold-plate 116 by a thermally conductive material 118. Thermally conductive material 118 may comprise the same material as thermally conductive material 112 in some examples; in other examples, thermally conductive material 118 may comprise a different material than thermally conductive material 112. In the figure, thermally conductive material 118 is shown as extending partially across a contact area between cold-plate 116 and hybrid heat spreader 102 merely as an example and not as a limitation. Thermally conductive material 118 may substantially cover the contact area between cold-plate 116 and hybrid heat spreader 102 in some examples. Other means of attachment, including brazing, soldering, etc. that provides a thermal path between cold-plate 116 and hybrid heat spreader 102 may also be used within the broad scope of the examples.

In some examples, hybrid heat spreader 102 may be shaped and sized to correspond to the shape and size of IC device 110. For example, hybrid heat spreader 102 may comprise a cavity into which IC device 110 may fit suitably. In other example, hybrid heat spreader 102 may partially or entirely surround IC device 110. Hybrid heat spreader 102 may be modular, for example, configured to be placed between any IC device 110 and cold-plate 116 suitably on PCB 114 without being attached to cold-plate 116. Thus, hybrid heat spreader 102 may be used on some IC devices 110 and not on others in system 100. In some examples, system 100 may comprise a plurality of hybrid heat spreaders 102 corresponding to another plurality of IC devices 110. Some IC devices 110 may be smaller or larger than other IC devices 110. Hybrid heat spreader 102 may be suitably shaped and sized for respective IC devices 110 in some examples. In other examples, hybrid heat spreader 102 may be of a standard (e.g., uniform) size and/or shape, so as to fit with any of IC devices 110 on PCB 114.

In various examples, cold-plate 116 may comprise pipes 120 configured for flow of a cooling fluid (not shown). In some examples, the cooling fluid may be a liquid coolant used in the AV, such as a 50-50 solution of ethylene glycol and water (e.g., 50% ethylene glycol and 50% water by volume). Any suitable cooling fluid, including deionized water, distilled water, etc. may be used in cold-plate 116 within the broad scope of the examples. In some examples, cold-plate 116 may comprise heat pipes; in yet other examples, cold-plate 116 may comprise a vapor chamber. Any suitable combination of material and design that can facilitate heat transfer from IC device 110 may be used in cold-plate 116 within the broad scope of the examples disclosed herein.

In many examples, one or more temperature sensors 122 may be communicatively coupled to hybrid heat spreader 102. In the example shown in the figure, temperature sensor 122 is attached to PCB 114. In some examples (not shown), temperature sensor 122 may be attached to IC device 110, although not integrated with it such that temperature sensor 122 may operate independent of IC device 110; in yet other examples, temperature sensor 122 may be in some other location in the AV. In many examples, temperature sensor 122 may comprise a thermocouple. In other examples, other types of temperature sensor 122 may be used without departing from the scope of the present disclosure. In the figure, only one temperature sensor 122 is shown; any number of temperature sensors 122 may be provisioned in system 100 within the broad scope of the examples.

Several different modes may be triggered during functioning of system 100, depending on the temperature sensed by temperature sensor 122. In a waiting mode, heating element 104 is not powered on, and temperature sensor 122 may sense various temperatures. In one example, in the waiting mode, temperature sensor 122 may sense ambient temperature (e.g., temperature around system 100) in some examples. In some other examples, temperature sensor 122 may sense temperature of IC device 110 in the waiting mode. In various examples, appropriate control circuitry may be coupled to temperature sensor 122 such that other operations are triggered based on the status of temperature sensor 122. Such control circuitry may be independent of the operations of IC device 110 although it may be coupled to PCB 114. In some examples, such control circuitry may be placed elsewhere in the AV and may be decoupled from PCB 114. When IC device 110 is not powered on, the ambient temperature may be the same as the temperature of IC device 110. When IC device 110 is powered on, it generates heat, which may cause the temperature of IC device 110 to be more than the ambient temperature. In some examples, when the temperature of IC device 110 as sensed by temperature sensor 122 is below the minimum operating temperature, a heating mode may be triggered. In the heating mode, heating element 104 is configured to power on. When the temperature of IC device 110 is above the minimum operating temperature, the waiting mode is triggered, and heating element 104 is configured to power off.

In many examples, in the heating mode, when heating element 104 is powered on, heat exchanger 106 is configured to conduct heat from heating element 104 to IC device 110, such that the temperature of IC device 110 is increased. In the waiting mode, when IC device 110 is powered on, and heating element 104 is powered off, heat exchanger 106 is further configured to conduct heat away from IC device 110 (for example, in conjunction with cold-plate 116) such that the temperature of IC device 110 is maintained or decreased. In some examples, cooling fluid may circulate in pipes 120 within cold-plate 116 to carry heat away from IC device 110 when IC device 110 is powered on; in some such examples, the cooling fluid may not circulate in pipes 120 when IC device 110 is not powered on. In many examples, heat exchanger 106 is configured to conduct heat away from IC device 110 when at least two of the following are true: (1) heating element 104 is powered off, (2) IC device 110 is powered on; and (3) IC device 110 is generating heat. Thus, in various examples, hybrid heat spreader 102 maintains the temperature of IC device 110 between the minimum operating temperature and the maximum operating temperature.

Figure 2:
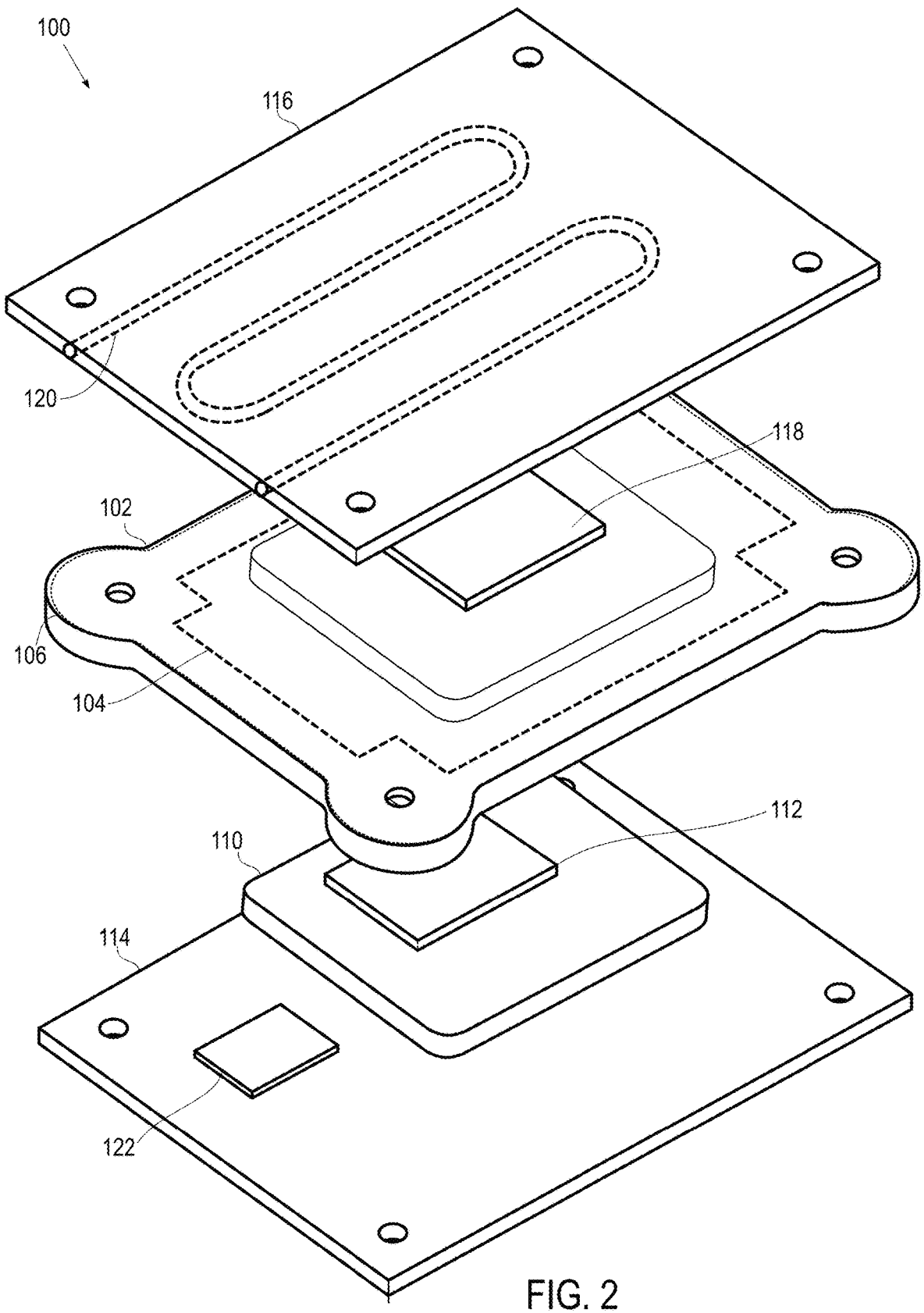
FIG. 2 illustrates a simplified exploded perspective view of another example system for hybrid heat spreading and heat transfer in an autonomous vehicle, according to some examples of the present disclosure.

FIG. 2 illustrates a simplified exploded perspective view of another example system 100 for hybrid heat spreading and heat transfer in an AV, according to some examples of the present disclosure. The example shown in the figure is substantially similar to that described in reference to FIG. 1 except that a different type of heating element 104 is provided. In the example shown in FIG. 2, heating element 104 is a flexible polyimide heater, shaped to envelop (without contact), IC device 110 on one or more sides.

Figure 3:
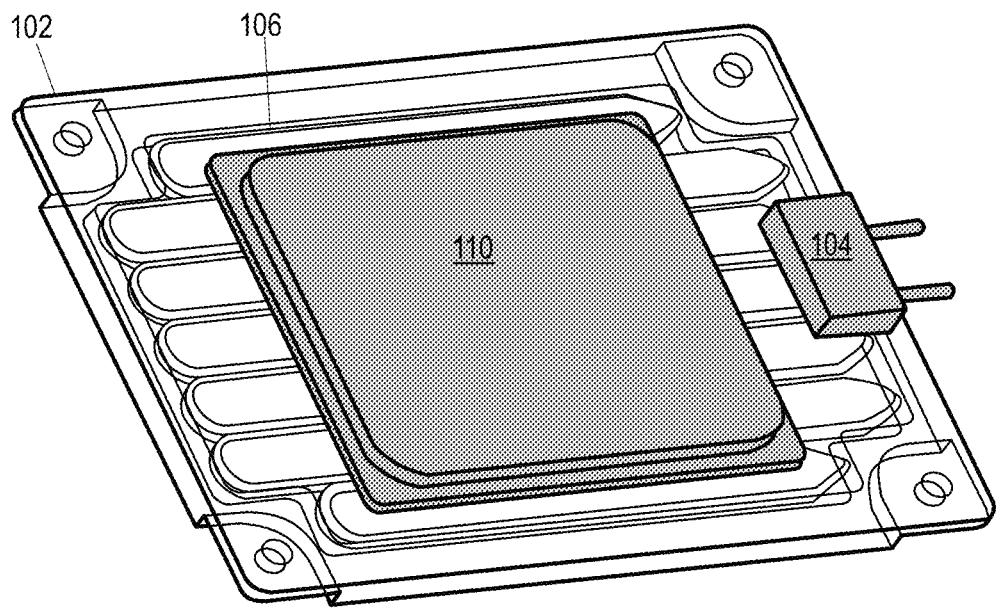
FIG. 3 illustrates a simplified perspective view of an example hybrid heat spreader, according to some examples of the present disclosure.

FIG. 3 illustrates a simplified perspective view of example hybrid heat spreader 102, according to some examples of the present disclosure. Hybrid heat spreader 102 may be removably attached to IC device 110. Heating element 104 may be in thermal contact with heat exchanger 106 suitably. In some examples, heating element 104 may be permanently attached to heat exchanger 106; in other examples, heating element 104 may be removably attached to heat exchanger 106. In the example shown in the figure, heat exchanger 106 comprises heat pipes configured in a serpentine coil within a case made of thermally conductive material (e.g., aluminum, copper, etc.).

In general, heat pipes are two-phase devices that transfer heat by phase-changing of the working fluid stored and/or moved through a wick within a sealed, enclosed space. The heat pipe may comprise any suitable type, such as copper enclosed with sintered wick structure, using water as the working fluid; copper enclosed with sintered wick, using water along with nitrogen or argon as working fluid; etc. In various examples, the enclosure of the heat pipes may be made of any suitable material that is compatible with the working fluid (e.g., water, nitrogen, etc.). In some examples, wickless heat pipes may also be used. Any suitable type of heat pipe may be used in heat exchanger 106 within the broad scope of the examples.

Hybrid heat spreader 102 may be of any suitable shape compatible with the shape and size of IC device 110. Heating element 104 may not be in contact with IC device 110, but may be in close proximity to IC device 110. In many examples, heating element 104 is in intimate contact with heat exchanger 106 so that heat from heating element 104 is transferred efficiently to IC device 110 during the heating mode. Note that in system 100, the "free surface" of IC device 110 shown in the figure is attached using suitable means (e.g., solder connections) to PCB 114 (not shown).

Figure 4:
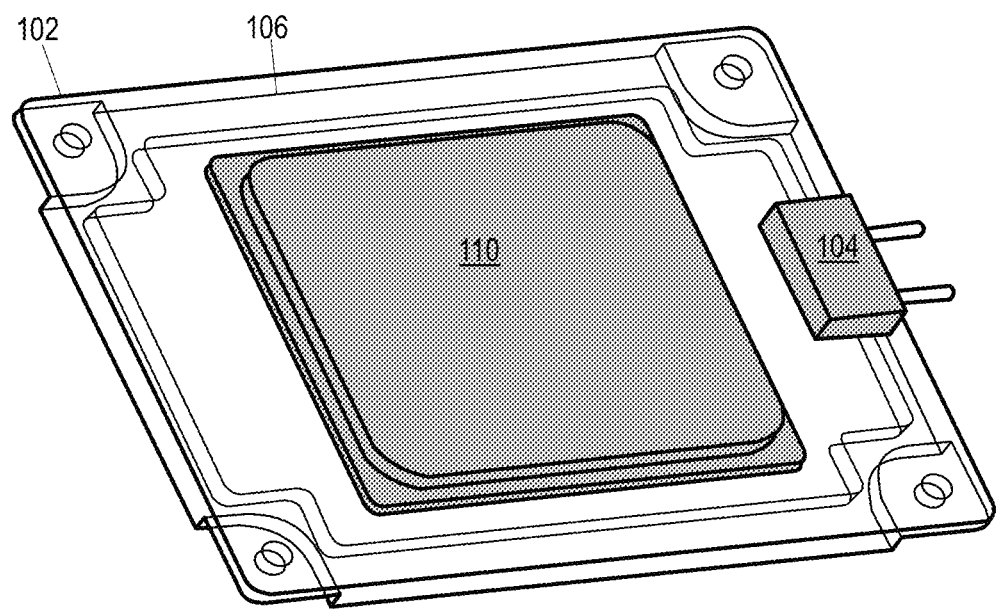
FIG. 4 illustrates a simplified perspective view of another example hybrid heat spreader, according to some examples of the present disclosure.

FIG. 4 illustrates a simplified perspective view of another example hybrid heat spreader 102, according to some examples of the present disclosure. The example shown in the figure is substantially similar to that described in reference to FIG. 3 except that instead of heat pipes, heat exchanger 106 comprises a continuous block of thermally conductive material, such as aluminum or copper. In such examples, heat transfer is by thermal conduction through the thermally conductive material.

In some examples (not shown in the figure), heat exchanger 106 may comprise a sealed, hollow enclosure made of thermally conductive material such as aluminum or copper, with a wick structure and working fluid filling the hollow space. The hollow space may substantially follow the shape and size of the enclosure itself to form a vapor chamber. In such examples, heat transfer is by phase change mechanisms, as with heat pipes.

FIGS. 5A-5E illustrates simplified views of various heating elements 104 used in example systems 100 for hybrid heat spreading and heat transfer in an AV, according to some examples of the present disclosure. In general, heating element 104 comprises a component composed of electrically conductive material and insulating material, designed to serve a heating purpose. Heating element 104 may comprise an assemblage of parts that includes a framework of insulating material and conductive lead connectors. Heating element 104 used in hybrid heat spreader 102 operates by resistive heating (e.g., Joule heating) when current is passed through one or more conductive element 502 encased in an insulative material 504. Leads 506 may permit conductive coupling of conductive element 502 with a power source (not shown). The choice of a particular type of heating element 104 may be driven by space considerations, amount of heating required, material compatibilities, and other factors beyond the scope of the present disclosure.

In various examples, conductive element 502 may be made from high-resistance metallic alloys such as iron-chromium-aluminum (Fe—Cr—Al) and nickel-chromium-iron (Ni—Cr(Fe)). Other choice of materials for conductive element 502 includes copper, nickel, aluminum, molybdenum, iron, tungsten and alloys containing combinations of these elements.

In some examples, positive temperature coefficient (PTC) heaters may also be used as heating element 104. PTC heaters contain trace amounts of an electrically conductive material such as carbon black mixed with an electrically insulating yet thermally conductive material such as silicone rubber. PTC heaters increase in electrical resistance as they get hotter, which may decrease the time it takes to heat IC device 110 to the desired temperature.

Figure 5A:
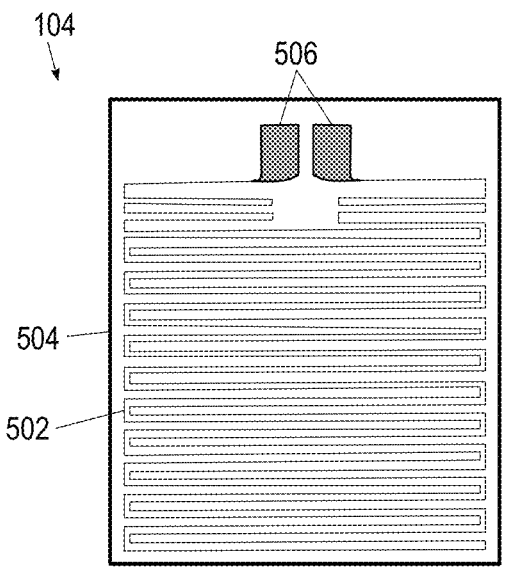
FIGS. 5A-5E illustrates simplified views of various heating elements used in example systems for hybrid heat spreading and heat transfer in an autonomous vehicle, according to some examples of the present disclosure.

FIG. 5A shows an example flexible polyimide heater. Insulative material 504 comprises a flexible polyimide material. In some examples, conductive element 502 may comprise an etched foil (e.g., 5 micrometers to 10 micrometers in thickness) encapsulated between two layers of insulative material 504, which in the example shown comprises a polyimide film. Flexible polyimide heaters may be available in a wide variety of shapes, as they can be shaped during manufacturing to fit complex geometries. Such heaters may be used in the example described in reference to FIG. 2. The example polyimide heater as shown in the figure may be attached to heat exchanger 106 using a thermally conductive adhesive.

Figure 5B:
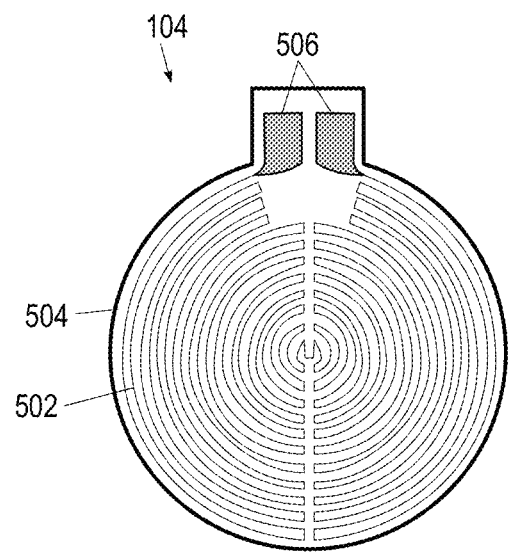

In another example, FIG. 5B shown another flexible polyimide heater, which is substantially similar to the example of FIG. 5A, except that it is circular in shape rather than rectangular. The example polyimide heater as shown in the figure may be attached to heat exchanger 106 using a thermally conductive material.

Figure 5C:
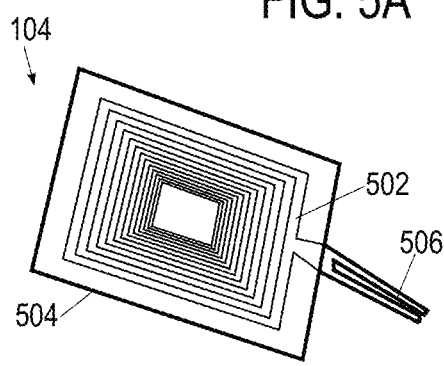

FIG. 5C shows a flexible silicone heater, which is similar to the flexible polyimide heaters of FIGS. 5A-5B, except that insulative material 504 comprises fiberglass reinforced silicone rubber. In addition, conductive elements 502 may comprise planar sheets or flat ribbons rather than round wires sealed within the silicone rubber enclosure. The example silicone heater as shown in the figure may be attached to heat exchanger 106 using a thermally conductive adhesive.

Figure 5D:
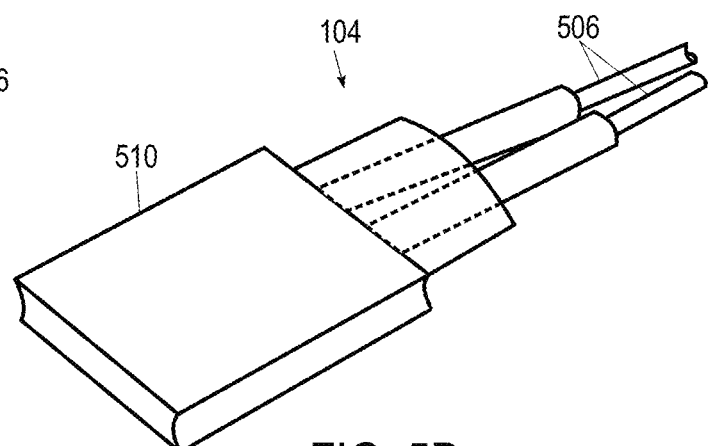

FIG. 5D shows a cartridge heater, in which a wire coil (not shown) is encased inside of an insulative sheath 510. In some examples, insulative sheath 510 is made of magnesium oxide. Other ceramic materials that have the ability to retain heat may also be used in such heaters within the wide scope of the examples disclosed herein. Heat from the wire coil transfers directly to insulative sheath 510, heating one or more (e.g., lower) surface of the heater. The heated surface of the heater may be in close proximity to heat exchanger 106 in such examples. Although a rectangular shape is shown, cartridge heaters may be available in cylindrical shapes as well, for example, as shown in the example of FIG. 1.

Figure 5E:
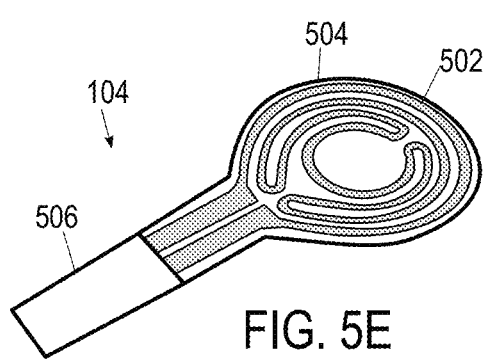

FIG. 5E shows an example open coil heater. Conductive element 502 in such examples comprises conductive coils commonly made from nickel-chromium or other metal alloy, held or suspended by insulative material 504, which may comprise ceramic or mica. The open coil heater is configured to expose conductive element 502 directly to heat exchanger 106. The coil shape allows a greater amount of heated surface area, increasing contact with heat exchanger 106.

Although only a few examples of heater types are shown in FIG. 5, any suitable heater type known in the art and suitable for use in hybrid heat spreader 102 may be included in the broad scope of the examples described herein.

Figure 6A:
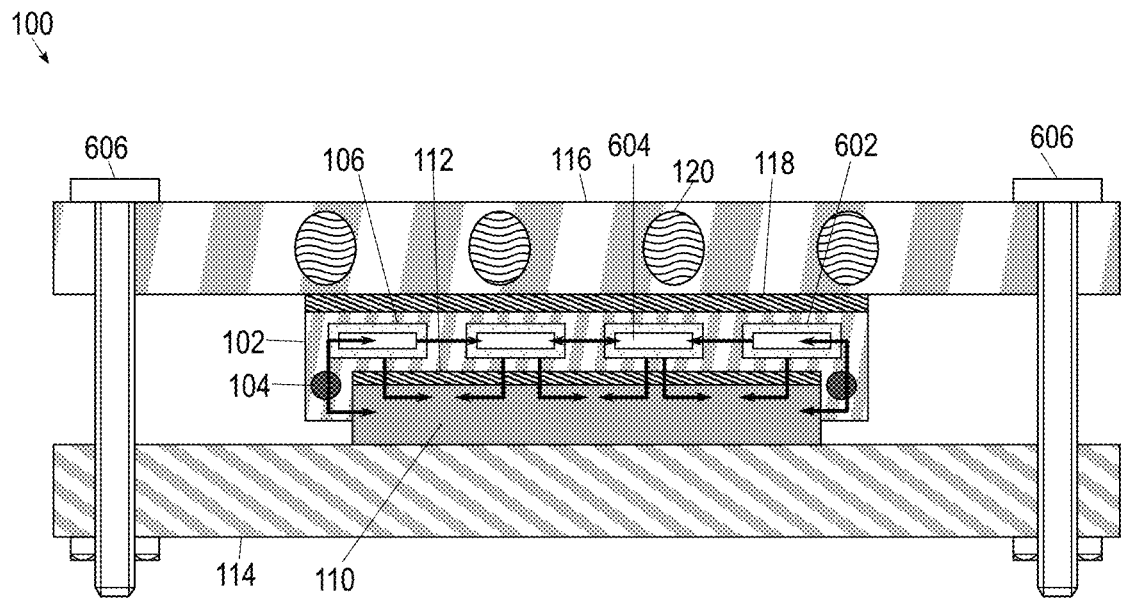
FIGS. 6A-6B are simplified cross-sectional views of example operations in a system for hybrid heat spreading and heat transfer in an autonomous vehicle, according to some examples of the present disclosure.
Figure 6B:
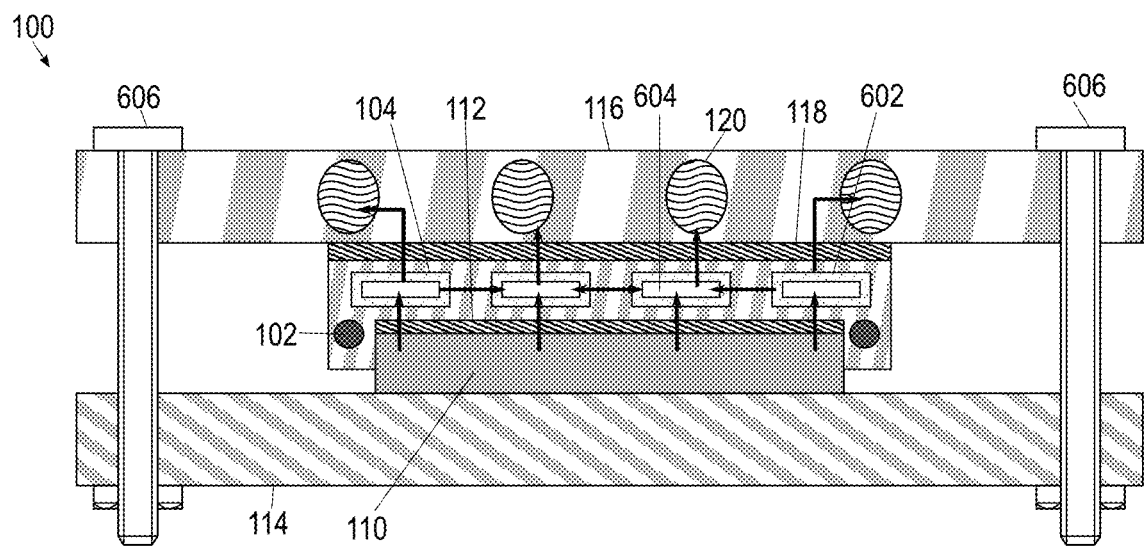

FIGS. 6A-6B are simplified cross-sectional views of example operations in system 100 for hybrid heat spreading and heat transfer in an AV, according to some examples of the present disclosure. The thick arrows in the figure depict movement of heat energy. FIG. 6A shows a configuration in which heating element 104 is powered on. Note that the type of heating element 104 shown in the figure is a cylindrical cartridge type; however, any suitable type of heating element 104 may be used without departing from the scope of the operations described herein.

IC device 110 may be attached to PCB 114. In the example shown, hybrid heat spreader 102 comprises a cavity within which IC device 110 is disposed. Thermally conductive material 112 may be used to thermally couple IC device 110 and hybrid heat spreader 102. In the example shown in the figure, heat exchanger 106 comprises heat pipes with a wick 602 enclosing a hollow space 604. Wick 602 allows movement of a liquid coolant, such as water, and hollow space 604 allows movement of the coolant in gaseous form, such as water vapor. Cold-plate 116 comprising pipes 120 (e.g., for moving a cooling fluid) may be thermally coupled to hybrid heat spreader 102 by thermally conductive material 118. Fasteners 608 may facilitate removably attaching cold-plate 116 to PCB 114. In some examples, PCB 114 may include a stiffener (not shown) that serves to prevent warping of PCB 114 when mechanically fastened to cold-plate 116 by fasteners 606.

During the heating mode, heating element 104 may be powered on when the temperature of IC device 110 is below the minimum operating temperature (e.g., 0° C.). Heat from heating element 104 may be directly conducted to the regions in IC device 110 proximate to heating element 104 through the thermally conductive material of hybrid heat spreader 102. In addition, heat may also be conducted to heat exchanger 106, which may transfer heat more rapidly to other regions of IC device 110 farther from heating element 104. Heat may also be conducted between the various coils of the heat pipe of heat exchanger 106 through the thermally conductive material of hybrid heat spreader 102 in some examples; in some other examples, there may be a void or air between the coils; in yet other examples, the coils of the heat pipe may be close together so as to be in contact with each other, permitting thermal conduction among the coils of the heat pipe.

FIG. 6B shows a configuration in which heating element 104 is powered off (e.g., in waiting mode), and IC device 110 is powered on and generating heat. In such configuration, heat from IC device 110 is conducted away from IC device 110 to cold-plate 116 through the thermally conductive materials between IC device 110 and cold-plate 116, including the thermally conductive material of hybrid heat spreader 102, and thermally conductive materials 112 and 118. In addition, heat may also be conducted to heat exchanger 106, which may transfer heat more rapidly to cold-plate 116.

Figure 7A:
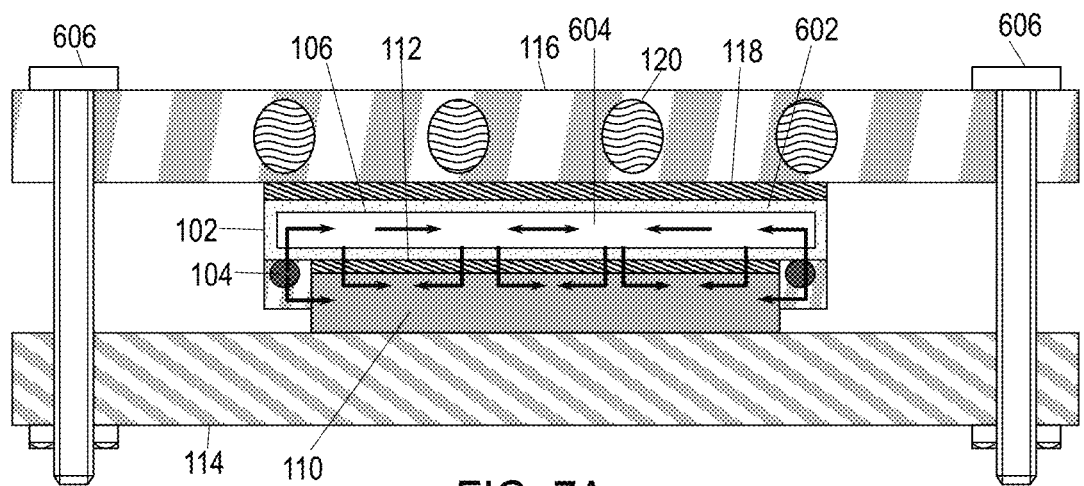
FIGS. 7A-7B are simplified cross-sectional views of example operations in a system for hybrid heat spreading and heat transfer in an autonomous vehicle, according to some examples of the present disclosure.
Figure 7B:
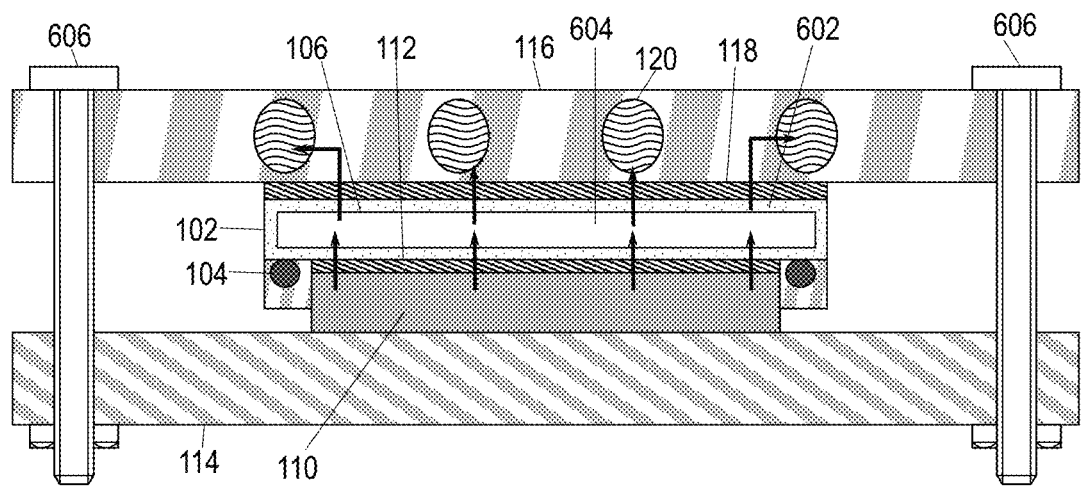

FIGS. 7A-7B are simplified cross-sectional views of example operations in system 100 for hybrid heat spreading and heat transfer in an AV, according to some examples of the present disclosure. The example and operations shown in the figure are substantially similar to those shown in FIG. 6, except that heat exchanger 106 comprises a vapor chamber. Unlike the heat pipe of FIG. 6, heat exchanger 106 in FIG. 7 comprises wick 602 surrounding space 604 that substantially encompasses a shape and volume of hybrid heat spreader 102.

As shown in FIG. 7A, during the heating mode, heating element 104 may be powered on when the temperature of IC device 110 is below the minimum operating temperature (e.g., 0° C.). Heat from heating element 104 may be directly conducted to the regions in IC device 110 proximate to heating element 104 through the thermally conductive material of hybrid heat spreader 102. In addition, heat may also be conducted to heat exchanger 106, which may transfer heat more rapidly to other regions of IC device 110 farther from heating element 104.

FIG. 7B shows a configuration in which heating element 104 is powered off (e.g., in waiting mode), and IC device 110 is powered on and generating heat. In such configuration, heat from IC device 110 is conducted away from IC device 110 to cold-plate 116 through the thermally conductive materials between IC device 110 and cold-plate 116, including the thermally conductive material of hybrid heat spreader 102, and thermally conductive materials 112 and 118. In addition, heat may also be conducted to heat exchanger 106, which may transfer heat more rapidly to cold-plate 116.

Figure 8A:
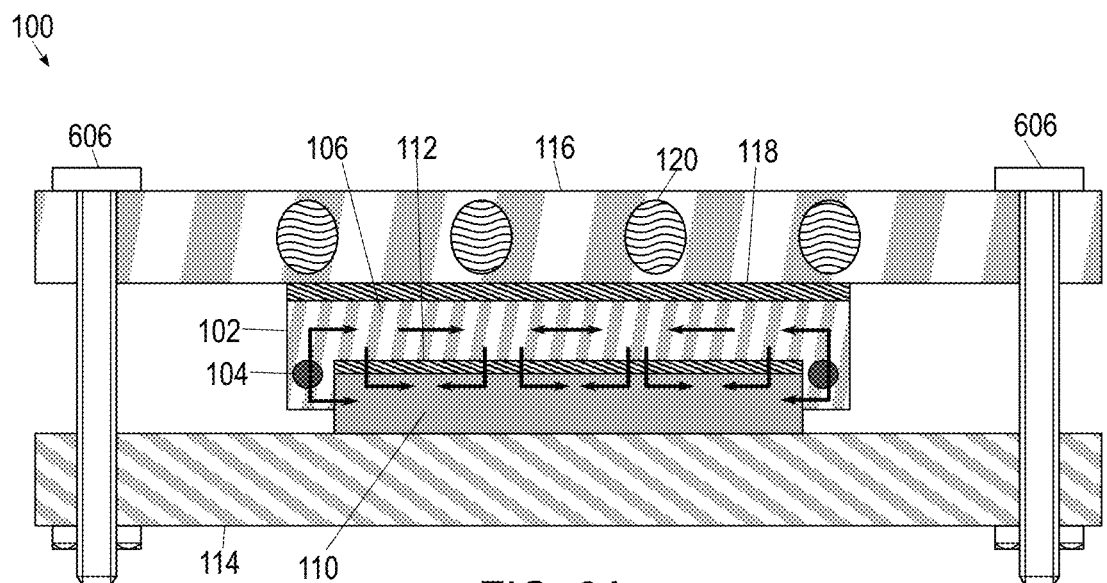
FIGS. 8A-8B are simplified cross-sectional views of example operations in a system for hybrid heat spreading and heat transfer in an autonomous vehicle, according to some examples of the present disclosure.
Figure 8B:
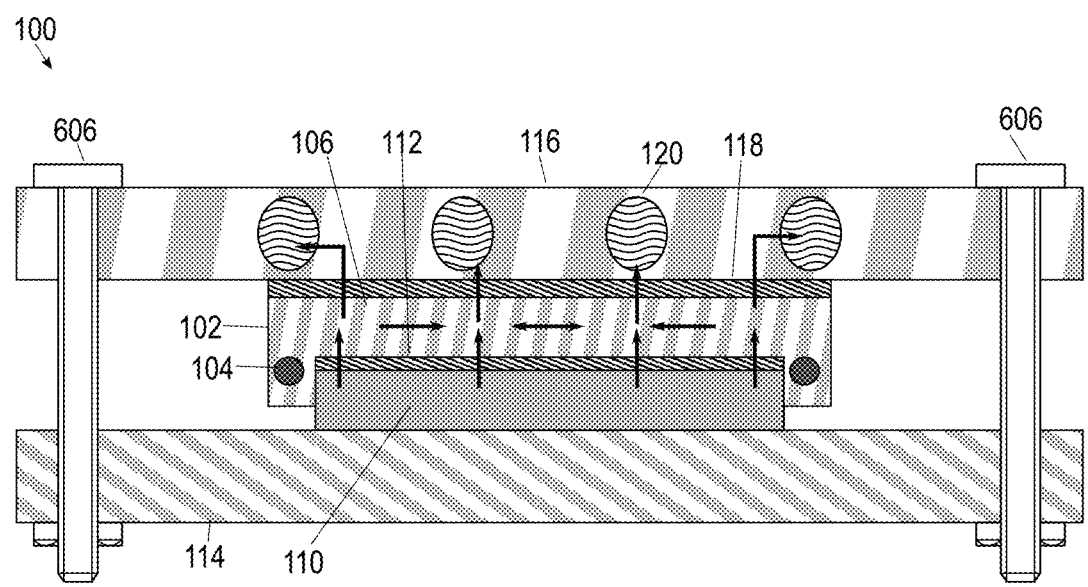

FIGS. 8A-8B are simplified cross-sectional views of example operations in system 100 for hybrid heat spreading and heat transfer in an AV, according to some examples of the present disclosure. The example and operations shown in the figure are substantially similar to those shown in FIGS. 6 and 7, except that heat exchanger 106 comprises a block of thermally conductive material without any heat pipe or other similar heat transfer mechanisms.

As shown in FIG. 8A, during the heating mode, heating element 104 may be powered on when the temperature of IC device 110 is below the minimum operating temperature (e.g., 0° C.). Heat from heating element 104 may be directly conducted to the regions in IC device 110 proximate to heating element 104 through the thermally conductive material of hybrid heat spreader 102. Heat may also be transferred to regions of IC device 110 farther from heating element 104 through the thermally conductive material of hybrid heat spreader 102.

FIG. 8B shows a configuration in which heating element 104 is powered off (e.g., in waiting mode), and IC device 110 is powered on and generating heat. In such configuration, heat from IC device 110 is conducted away from IC device 110 to cold-plate 116 through the thermally conductive materials between IC device 110 and cold-plate 116, including the thermally conductive material of hybrid heat spreader 102, and thermally conductive materials 112 and 118.

Figure 9A:
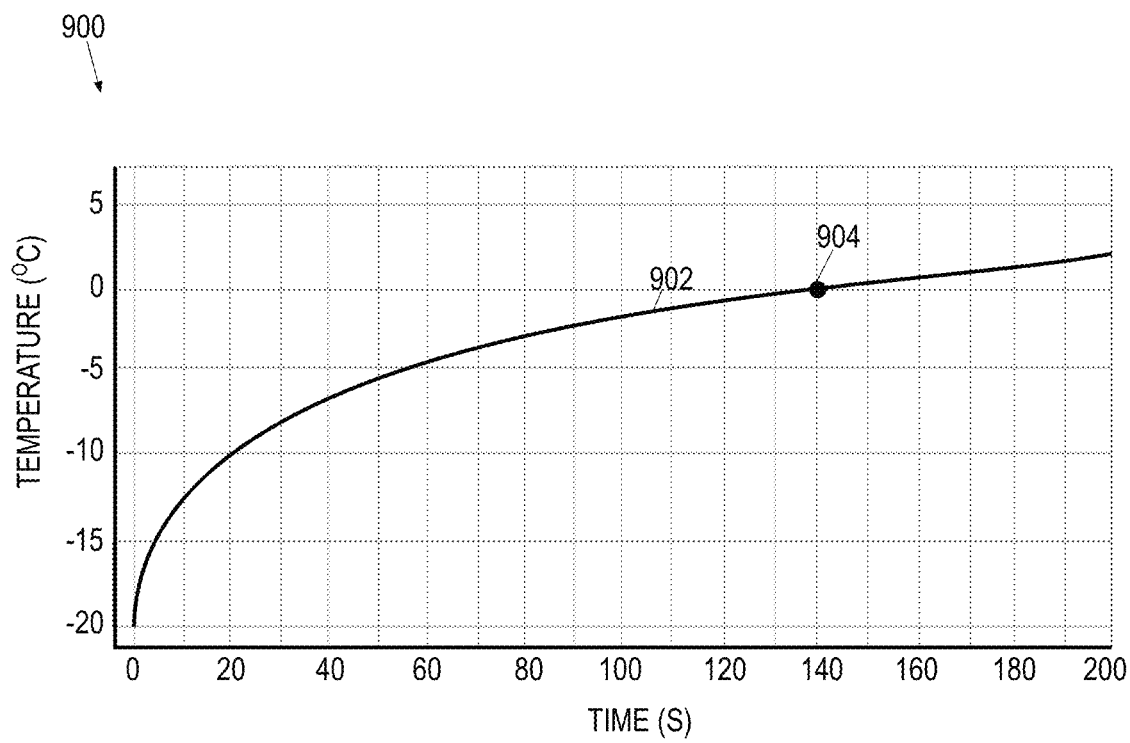
FIGS. 9A-9B are graphs of rate of increase of temperature in example systems for hybrid heat spreading and heat transfer in an autonomous vehicle, according to some examples of the present disclosure.
Figure 9B:
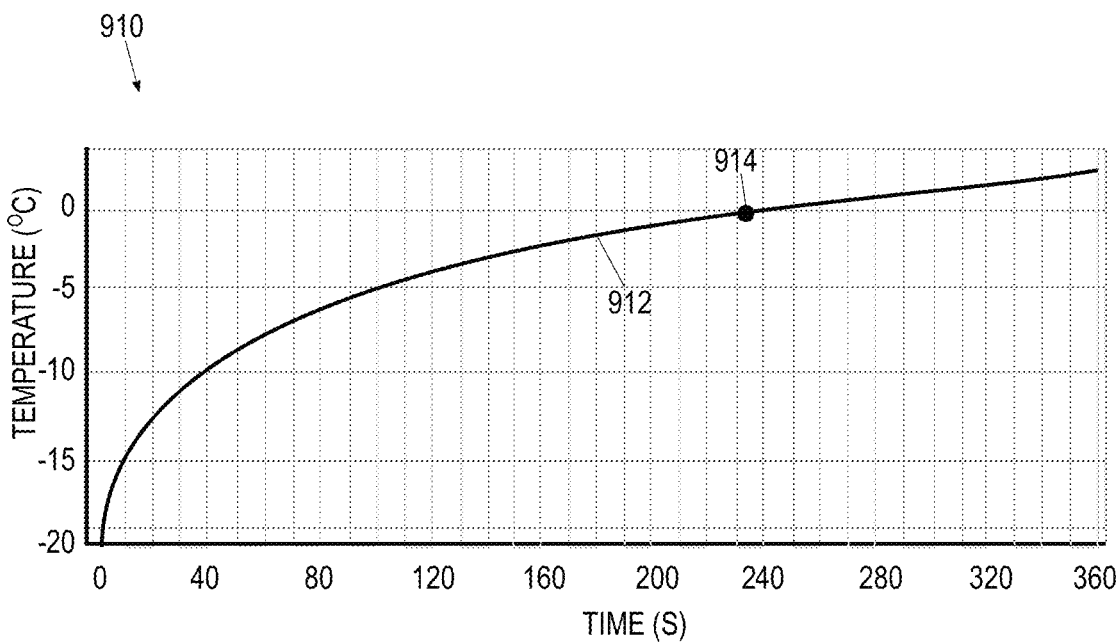

FIGS. 9A-9B are graphs 900 and 910 respectively of rate of increase of temperature in example systems for hybrid heat spreading and heat transfer in an AV, according to some examples of the present disclosure. FIG. 9A shows a curve 902 representing the rate of increase of temperature of IC device 110 using hybrid heat spreader 102 comprising heat pipes in heat exchanger 106, for example, as described in reference to FIG. 6. Point 904 represents a time taken to reach the minimum operating temperature (e.g., 0° C.). It may be noted that in approximately 150 seconds, the minimum operating temperature may be reached.

FIG. 9B shows a curve 912 representing the rate of increase of temperature of IC device 110 using hybrid heat spreader 102 comprising only thermally conductive material in heat exchanger 106, for example, as described in reference to FIG. 8. Point 914 represents a time taken to reach the minimum operating temperature (e.g., 0° C.). It may be noted that the minimum operating temperature may be reached in approximately 230 seconds, which is longer than with heat pipes in heat exchanger 106, as described in reference to FIG. 9.

FIG. 10 is a simplified block diagram illustrating example system 100 for hybrid heat spreading and heat transfer in an AV, according to some examples of the present disclosure. Temperature sensor 122 may be electrically coupled to a comparator 1002. In many examples, comparator 1002 may be a voltage comparator. In other examples, comparator 1002 may be a current comparator. In yet other examples, comparator 1002 may comprise a digital device. In some examples, comparator 1002 may be part of a microcontroller inside the AV. In some examples, comparator 1002 may be coupled to PCB 114; in other examples, comparator 1002 may be elsewhere in the AV. Comparator 1002 may be electrically coupled to a power source 1004. In many examples, power source 1004 comprises a battery of the AV; the battery may be configured to provide power to other components inside the vehicle. Power source 1004 may be electrically coupled to heating element 104 of hybrid heat spreader 102. Heating element 104 may be thermally coupled to heat exchanger 106, which in turn is thermally coupled to IC device 110 and to cold-plate 116.

During operation of system 100, in the waiting mode and the heating mode, comparator 1002 is configured to receive signals indicative of the temperature of IC device 110 from temperature sensor 122. In some examples, the signals may be indicative of the ambient temperature, and it may be assumed that IC device 110 is at the same temperature as the ambient temperature when IC device 110 is not powered on. Comparator 1002 may have stored in it (or alternatively, may have access to a storage device that has stored in it) a reference signal value corresponding to the minimum operating temperature. Comparator 1002 may compare the signals from temperature sensor 122 with the stored reference signal value and determine whether the temperature sensed by temperature sensor 122 is less than the minimum operating temperature. If the temperature sensed by temperature sensor 122 is less than the minimum operating temperature, the heating mode may be triggered: comparator 1002 may power on power source 1004, for example, through a switch. Then, power may be delivered to heating element 104 from power source 1004, powering on hybrid heat spreader 102.

Heat from heating element 104 may be delivered to IC device 110 by heat exchanger 106. The temperature of IC device 110 may consequently increase. When the temperature of IC device 110 reaches a value greater than the minimum operating temperature, the heating mode may be turned off and the waiting mode may be triggered: comparator 1002 may consequently power off power source 1004, stopping power delivery to heating element 104. In some examples, comparator 1002 may be electrically coupled to IC device 110 such that signals may be received at comparator 1002 indicating that IC device 110 has powered on; then, comparator 1002 may power off power source 1004. Thereafter IC device 110 may begin to heat up by virtue of its own operation. Heat from IC device 110 may be delivered to cold-plate 116 by way of heat exchanger 106.

Figure 11:
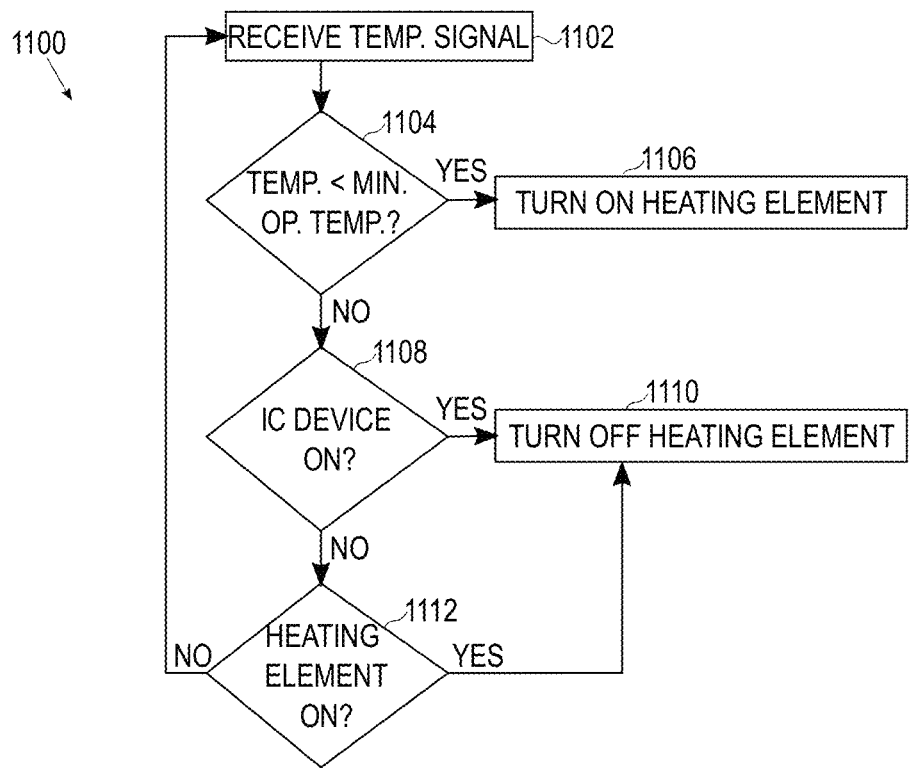
FIG. 11 is a simplified flow diagram illustrating example operations of a system for hybrid heat spreading and heat transfer in an autonomous vehicle, according to some examples of the present disclosure.

FIG. 11 is a simplified flow diagram illustrating example operations 1100 at comparator 1002 in system 100 for hybrid heat spreading and heat transfer in an AV, according to some examples of the present disclosure. At 1102, comparator 1002 may receive temperature signals indicative of the temperature of IC device 110 from temperature sensor 122. In some examples, the temperature signals may be received directly from temperature sensor 122. In other examples, the temperature signals may be received from temperature sensor 122 by way of other components, such as through a microcontroller. In some examples, the temperature signal may be an aggregate or average of signals from a plurality of temperature sensors 122.

At 1104, a determination may be made by comparator 1002 whether the temperature as indicated by the temperature signal is less than the minimum operating temperature of IC device 110. If the temperature as indicated by the temperature signal is less than the minimum operating temperature of IC device 110, the heating mode may be triggered, and heating element 104 may be powered on at 1106, for example, by powering on power source 1004. If the temperature as indicated by the temperature signal is not less than the minimum operating temperature of IC device 110, a determination may be made at 1108 whether IC device 110 is powered on. If IC device 110 is powered on, the waiting mode may be set, and heating element 104 may be powered off at 1110. In some examples, comparator 1002 may power on heating element 104 at 1106 only if IC device 110 is also not powered on as determined at 1108. If IC device 110 is not powered on, a determination may be made at 1112 if heating element 104 is powered on. If heating element 104 is powered on (i.e., heating element 104 is operating in the heating mode), the operations may revert to 1110, at which heating element 104 may be powered off, for example, to prevent overheating of IC device 110. If heating element 104 is not powered on, the operations may revert to 1102, and comparator 1002 may await another temperature signal.

Figure 12:
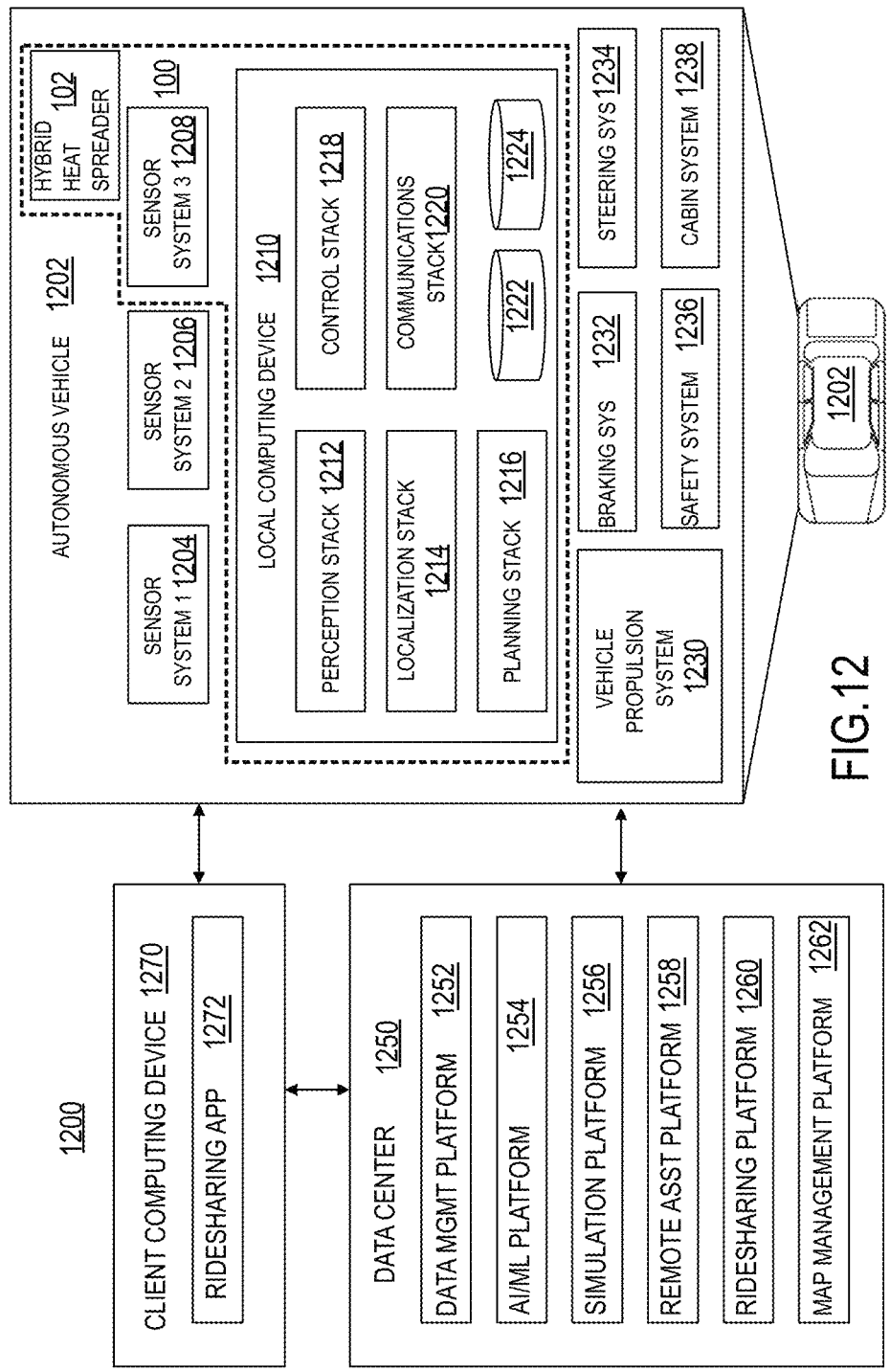
FIG. 12 illustrates an example system environment that can be used to facilitate autonomous vehicle (AV) dispatch and operations, according to some aspects of the disclosed technology.

Turning now to FIG. 12, this figure illustrates an example of an AV management system 1200. One of ordinary skill in the art will understand that, for the AV management system 1200 and any system discussed in the present disclosure, there can be additional or fewer components in similar or alternative configurations. The illustrations and examples provided in the present disclosure are for conciseness and clarity. Other examples may include different numbers and/ or types of elements, but one of ordinary skill the art will appreciate that such variations do not depart from the scope of the present disclosure.

In this example, the AV management system 1200 includes an AV 1202, a data center 1250, and a client computing device 1270. The AV 1202, the data center 1250, and the client computing device 1270 can communicate with one another over one or more networks (not shown), such as a public network (e.g., the Internet, an Infrastructure as a Service (IaaS) network, a Platform as a Service (PaaS) network, a Software as a Service (SaaS) network, another Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

AV 1202 can navigate about roadways without a human driver based on sensor signals generated by multiple sensor systems 1204, 1206, and 1208. The sensor systems 1204-1208 can include different types of sensors and can be arranged about the AV 1202. For instance, the sensor systems 1204-1208 can comprise Inertial Measurement Units (IMUs), cameras (e.g., still image cameras, video cameras, etc.), light sensors (e.g., LIDAR systems, ambient light sensors, infrared sensors, etc.), RADAR systems, a Global Navigation Satellite System (GNSS) receiver, (e.g., Global Positioning System (GPS) receivers), audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 1204 can be a camera system, the sensor system 1206 can be a LIDAR system, and the sensor system 1208 can be a RADAR system. Other examples may include any other number and type of sensors.

AV 1202 can also include several mechanical systems that can be used to maneuver or operate AV 1202. For instance, the mechanical systems can include vehicle propulsion system 1230, braking system 1232, steering system 1234, safety system 1236, and cabin system 1238, among other systems. Vehicle propulsion system 1230 can include an electric motor, an internal combustion engine, or both. The braking system 1232 can include an engine brake, a wheel braking system (e.g., a disc braking system that utilizes brake pads), hydraulics, actuators, and/or any other suitable componentry configured to assist in decelerating AV 1202. The steering system 1234 can include suitable componentry configured to control the direction of movement of the AV 1202 during navigation. Safety system 1236 can include lights and signal indicators, a parking brake, airbags, and so forth. The cabin system 1238 can include cabin temperature control systems, in-cabin entertainment systems, and so forth. In some examples, the AV 1202 may not include human driver actuators (e.g., steering wheel, handbrake, foot brake pedal, foot accelerator pedal, turn signal lever, window wipers, etc.) for controlling the AV 1202. Instead, the cabin system 1238 can include one or more client interfaces (e.g., Graphical User Interfaces (GUIs), Voice User Interfaces (VUIs), etc.) for controlling certain aspects of the mechanical systems 1230-1238.

AV 1202 can additionally include a local computing device 1210 that is in communication with the sensor systems 1204-1208, the mechanical systems 1230-1238, the data center 1250, and the client computing device 1270, among other systems. The local computing device 1210 can include one or more processors and memory, including instructions that can be executed by the one or more processors. The instructions can make up one or more software stacks or components responsible for controlling the AV 1202; communicating with the data center 1250, the client computing device 1270, and other systems; receiving inputs from riders, passengers, and other entities within the AV's environment; logging metrics collected by the sensor systems 1204-1208; and so forth. In this example, the local computing device 1210 includes a perception stack 1212, a mapping and localization stack 1214, a planning stack 1216, a control stack 1218, a communications stack 1220, an High Definition (HD) geospatial database 1222, and an AV operational database 1224, among other stacks and systems.

Perception stack 1212 can enable the AV 1202 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 1204-1208, the mapping and localization stack 1214, the HD geospatial database 1222, other components of the AV, and other data sources (e.g., the data center 1250, the client computing device 1270, third-party data sources, etc.). The perception stack 1212 can detect and classify objects and determine their current and predicted locations, speeds, directions, and the like. In addition, the perception stack 1212 can determine the free space around the AV 1202 (e.g., to maintain a safe distance from other objects, change lanes, park the AV, etc.). The perception stack 1212 can also identify environmental uncertainties, such as where to look for moving objects, flag areas that may be obscured or blocked from view, and so forth.

Mapping and localization stack 1214 can determine the AV's position and orientation (pose) using different methods from multiple systems (e.g., GPS, IMUs, cameras, LIDAR, RADAR, ultrasonic sensors, the HD geospatial database 1222, etc.). For example, in some examples, the AV 1202 can compare sensor data captured in real-time by the sensor systems 404-408 to data in the HD geospatial database 1222 to determine its precise (e.g., accurate to the order of a few centimeters or less) position and orientation. The AV 1202 can focus its search based on sensor data from one or more first sensor systems (e.g., GPS) by matching sensor data from one or more second sensor systems (e.g., LIDAR). If the mapping and localization information from one system is unavailable, the AV 1202 can use mapping and localization information from a redundant system and/or from remote data sources.

The planning stack 1216 can determine how to maneuver or operate the AV 1202 safely and efficiently in its environment. For example, the planning stack 1216 can receive the location, speed, and direction of the AV 1202, geospatial data, data regarding objects sharing the road with the AV 1202 (e.g., pedestrians, bicycles, vehicles, ambulances, buses, cable cars, trains, traffic lights, lanes, road markings, etc.) or certain events occurring during a trip (e.g., an Emergency Vehicle (EMV) blaring a siren, intersections, occluded areas, street closures for construction or street repairs, Double-Parked Vehicles (DPVs), etc.), traffic rules and other safety standards or practices for the road, user input, and other relevant data for directing the AV 1202 from one point to another. The planning stack 1216 can determine multiple sets of one or more mechanical operations that the AV 1202 can perform (e.g., go straight at a specified speed or rate of acceleration, including maintaining the same speed or decelerating; power on the left blinker, decelerate if the AV is above a threshold range for turning, and turn left; power on the right blinker, accelerate if the AV is stopped or below the threshold range for turning, and turn right; decelerate until completely stopped and reverse; etc.), and select the best one to meet changing road conditions and events. If something unexpected happens, the planning stack 1216 can select from multiple backup plans to carry out. For example, while preparing to change lanes to turn right at an intersection, another vehicle may aggressively cut into the destination lane, making the lane change unsafe. The planning stack 1216 could have already determined an alternative plan for such an event, and upon its occurrence, help to direct the AV 1202 to go around the block instead of blocking a current lane while waiting for an opening to change lanes.

The control stack 1218 can manage the operation of the vehicle propulsion system 1230, the braking system 1232, the steering system 1234, the safety system 1236, and the cabin system 1238. The control stack 1218 can receive sensor signals from the sensor systems 1204-1208 as well as communicate with other stacks or components of the local computing device 1210 or a remote system (e.g., the data center 1250) to effectuate operation of the AV 1202. For example, the control stack 1218 can implement the final path or actions from the multiple paths or actions provided by the planning stack 1216. This can involve turning the routes and decisions from the planning stack 1216 into commands for the actuators that control the AV's steering, throttle, brake, and drive unit.

The communication stack 1220 can transmit and receive signals between the various stacks and other components of the AV 1202 and between the AV 1202, the data center 1250, the client computing device 1270, and other remote systems. The communication stack 1220 can enable the local computing device 1210 to exchange information remotely over a network, such as through an antenna array or interface that can provide a metropolitan WIFI® network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). The communication stack 420 can also facilitate local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Bluetooth®, infrared, etc.).

The HD geospatial database 1222 can store HD maps and related data of the streets upon which the AV 1202 travels. In some examples, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane or road centerline, lane boundaries, type of lane boundaries, etc.) and related attributes (e.g., direction of travel, speed limit, lane type, etc.). The lanes and boundaries layer can also include 3D attributes related to lanes (e.g., slope, elevation, curvature, etc.). The intersections layer can include geospatial information of intersections (e.g., crosswalks, stop lines, turning lane centerlines, and/or boundaries, etc.) and related attributes (e.g., permissive, protected/permissive, or protected only left turn lanes; permissive, protected/permissive, or protected only U-turn lanes; permissive or protected only right turn lanes; etc.). The traffic controls layer can include geospatial information of traffic signal lights, traffic signs, and other road objects and related attributes.

The AV operational database 1224 can store raw AV data generated by the sensor systems 404-408 and other components of the AV 1202 and/or data received by the AV 1202 from remote systems (e.g., the data center 1250, the client computing device 1270, etc.). In some examples, the raw AV data can include HD LIDAR point cloud data, image or video data, RADAR data, GPS data, and other sensor data that the data center 450 can use for creating or updating AV geospatial data.

The data center 1250 can be a private cloud (e.g., an enterprise network, a co-location provider network, etc.), a public cloud (e.g., an IaaS network, a PaaS network, a SaaS network, or other CSP network), a hybrid cloud, a multi-cloud, and so forth. The data center 1250 can include one or more computing devices remote to the local computing device 1210 for managing a fleet of AVs and AV-related services. For example, in addition to managing the AV 1202, the data center 450 may also support a ridesharing service, a delivery service, a remote/roadside assistance service, street services (e.g., street mapping, street patrol, street cleaning, street metering, parking reservation, etc.), and the like.

The data center 1250 can send and receive various signals to and from the AV 1202 and the client computing device 1270. These signals can include sensor data captured by the sensor systems 1204-1208, roadside assistance requests, software updates, ridesharing pick-up and drop-off instructions, and so forth. In this example, the data center 1250 includes one or more of a data management platform 1252, an Artificial Intelligence/Machine Learning (AI/ML) platform 1254, a simulation platform 1256, a remote assistance platform 1258, a ridesharing platform 1260, and a map management platform 1262, among other systems.

Data management platform 1252 can be a "big data" system capable of receiving and transmitting data at high speeds (e.g., near real-time or real-time), processing a large variety of data, and storing large volumes of data (e.g., terabytes, petabytes, or more of data). The varieties of data can include data having different structures (e.g., structured, semi-structured, unstructured, etc.), data of different types (e.g., sensor data, mechanical system data, ridesharing service data, map data, audio data, video data, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), or data having other heterogeneous characteristics. The various platforms and systems of the data center 1250 can access data stored by the data management platform 1252 to provide their respective services.

The AI/ML platform 1254 can provide the infrastructure for training and evaluating machine learning algorithms for operating the AV 1202, the simulation platform 1256, the remote assistance platform 1258, the ridesharing platform 1260, the map management platform 1262, and other platforms and systems. Using the AI/ML platform 1254, data scientists can prepare data sets from the data management platform 1252; select, design, and train machine learning models; evaluate, refine, and deploy the models; maintain, monitor, and retrain the models; and so on.

The simulation platform 1256 can enable testing and validation of the algorithms, machine learning models, neural networks, and other development efforts for the AV 1202, the remote assistance platform 1258, the ridesharing platform 1260, the map management platform 1262, and other platforms and systems. The simulation platform 1256 can replicate a variety of driving environments and/or reproduce real-world scenarios from data captured by the AV 1202, including rendering geospatial information and road infrastructure (e.g., streets, lanes, crosswalks, traffic lights, stop signs, etc.) obtained from the map management platform 1262; modeling the behavior of other vehicles, bicycles, pedestrians, and other dynamic elements; simulating inclement weather conditions, different traffic scenarios; and so on.

The remote assistance platform 1258 can generate and transmit instructions regarding the operation of the AV 1202. For example, in response to an output of the AI/ML platform 1254 or other system of the data center 1250, the remote assistance platform 1258 can prepare instructions for one or more stacks or other components of the AV 1202.

The ridesharing platform 1260 can interact with a customer of a ridesharing service via a ridesharing application 1272 executing on the client computing device 470. The client computing device 1270 can be any type of computing system, including a server, desktop computer, laptop, tablet, smartphone, smart wearable device (e.g., smart watch; smart eyeglasses or other Head-Mounted Display (HMD); smart ear pods or other smart in-ear, on-ear, or over-ear device; etc.), gaming system, or other general-purpose computing device for accessing the ridesharing application 1272. The client computing device 1270 can be a customer's mobile computing device or a computing device integrated with the AV 1202 (e.g., the local computing device 1210). The ridesharing platform 1260 can receive requests to be picked up or dropped off from the ridesharing application 1272 and dispatch the AV 1202 for the trip.

Map management platform 1262 can provide a set of tools for the manipulation and management of geographic and spatial (geospatial) and related attribute data. The data management platform 1252 can receive LIDAR point cloud data, image data (e.g., still image, video, etc.), RADAR data, GPS data, and other sensor data (e.g., raw data) from one or more AVs 1202, Unmanned Aerial Vehicles (UAVs), satellites, third-party mapping services, and other sources of geospatially referenced data. The raw data can be processed, and map management platform 1262 can render base representations (e.g., tiles (2D), bounding volumes (3D), etc.) of the AV geospatial data to enable users to view, query, label, edit, and otherwise interact with the data. Map management platform 1262 can manage workflows and tasks for operating on the AV geospatial data. Map management platform 1262 can control access to the AV geospatial data, including granting or limiting access to the AV geospatial data based on user-based, role-based, group-based, task-based, and other attribute-based access control mechanisms. Map management platform 1262 can provide version control for the AV geospatial data, such as to track specific changes that (human or machine) map editors have made to the data and to revert changes when necessary. Map management platform 1262 can administer release management of the AV geospatial data, including distributing suitable iterations of the data to different users, computing devices, AVs, and other consumers of HD maps. Map management platform 1262 can provide analytics regarding the AV geospatial data and related data, such as to generate insights relating to the throughput and quality of mapping tasks.

In some examples, the map viewing services of map management platform 1262 can be modularized and deployed as part of one or more of the platforms and systems of the data center 1250. For example, the AI/ML platform 1254 may incorporate the map viewing services for visualizing the effectiveness of various object detection or object classification models, the simulation platform 1256 may incorporate the map viewing services for recreating and visualizing certain driving scenarios, the remote assistance platform 1258 may incorporate the map viewing services for replaying traffic incidents to facilitate and coordinate aid, the ridesharing platform 1260 may incorporate the map viewing services into the client application 1272 to enable passengers to view the AV 1202 in transit en route to a pick-up or drop-off location, and so on.

In many examples, temperature sensor 122 may be part of one or more sensor systems 1204-1208. For example, temperature sensor 122 may be comprised in sensor system 1208. IC device 110 may include local computing device 1210. Hybrid heat spreader 102 may be another portion of AV 1202. Other parts of system 100 for hybrid heat spreading and heat transfer may be comprised appropriately in various components and blocks of the figure.

Figure 13:
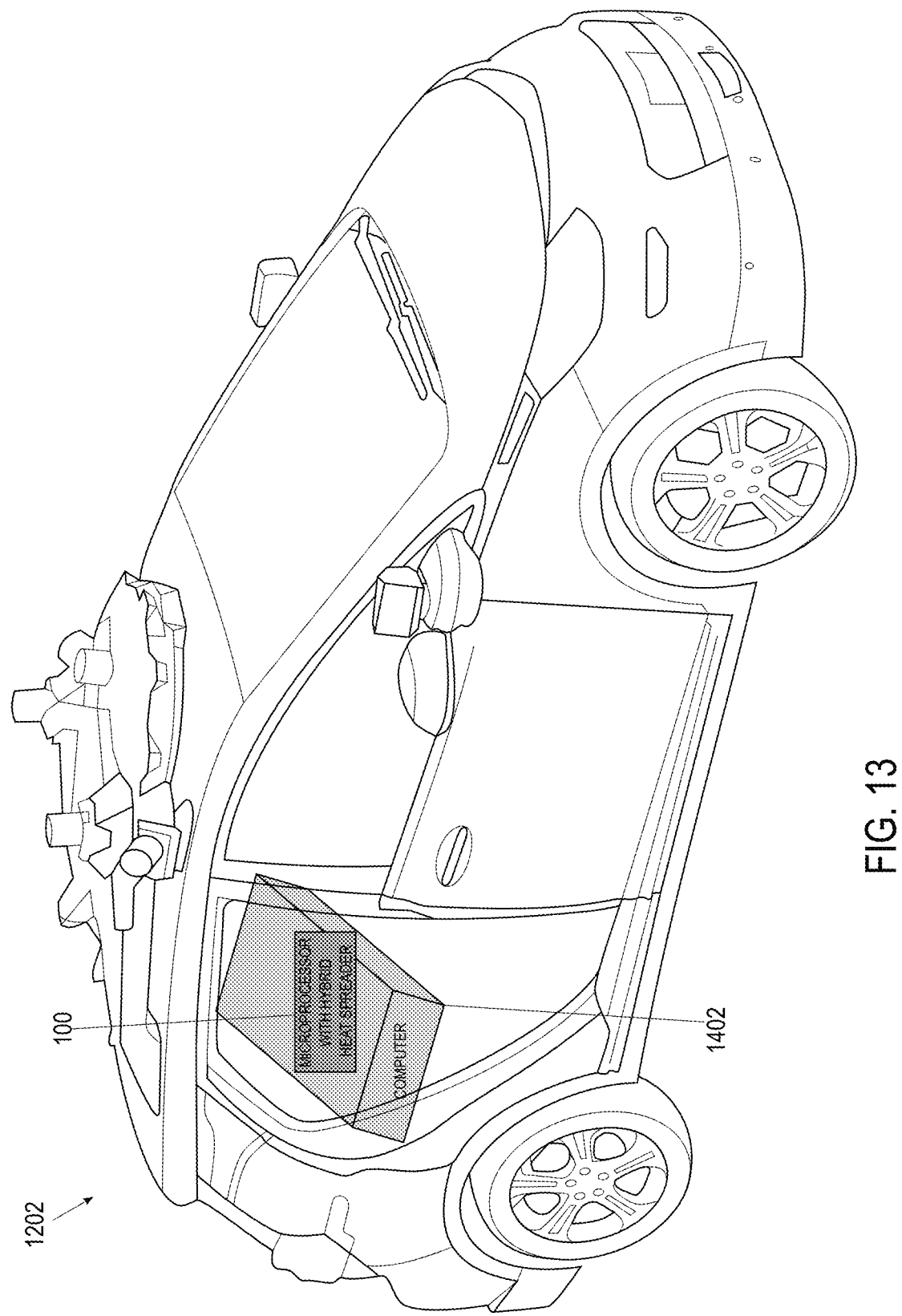
FIG. 13 is a schematic representation of an AV with an example system for hybrid heat spreading and heat transfer, according to some examples of the present disclosure.

FIG. 13 is a schematic representation of an AV 1202 with example system 100 for hybrid heat spreading and heat transfer, according to some examples of the present disclosure. Although AV 1202 is shown as a sedan, any suitable type of vehicle may be used with system 100 within the scope of the present disclosure. In various examples, IC device 110 as described in reference to FIGS. 1-11 may be included within AV management system 1200 and/or computing system 1300 as described in reference to FIGS. 12-13. IC device 110 may include any suitable component that performs any or some of the functionalities as described in FIGS. 12-13. For example, IC device 110 may comprise local computing device 1210. In another example, IC device 110 may comprise part of control stack 1218. Likewise, temperature sensor 122 may form part of sensor systems 1204-1208.

In some examples, one or more functionalities of AV management system 1200 may be comprised in an on-board computer 1402. In various examples, computer 1402 may be an Automated Driving System Computer (ADSC). In such examples, IC device 110 may include a microprocessor and/or other semiconductor IC devices of the ADSC. In many examples, given its size, computer 1402 may be installed in a trunk of AV 1202 or toward a rear of AV 1202, although it will be recognized that the features of examples described herein may be advantageously deployed in systems in which computer 1402 is enclosed in another area of AV 1202. In some examples, components of computer 1402, proximate to the microprocessor, may perform functions of heating element 104, such as generating heat to increase the temperature of the microprocessor therein. Such components and configurations are included among examples of heating element 104 as described herein. Computer 1402 may be removably attached to the chassis of AV 1202 and/or otherwise coupled to other systems of AV 1202 by any number of wireless or wired communication pathways. In many examples, computer 1402 is configured to connect to various sensors of AV 1202 and store large amounts of vehicle camera and sensor data in different kinds of storage devices, including solid-state data storage devices.

When AV 1202 is not normally operating (e.g., being driven), a temperature of computer 1402, including system 100, may be the ambient temperature. In situations where the ambient temperature is less than the minimum operating temperature of the microprocessor, the various operations and features as described in the previous figures may be used to enable microprocessor to be heated above its minimum operating temperature and prevent catastrophic failure and/or mitigate thermomechanical reliability problems of computer 1402.

SELECTED EXAMPLES

Example 1 provides an apparatus (e.g., 102, FIG. 1), comprising: a heating element (e.g., 104); and a heat exchanger (e.g., 106) proximate to the heating element, in which: the apparatus is configured to be thermally coupled to an IC device (e.g., 110), the IC device is configured to operate above a minimum operating temperature, the heating element is configured to: power on when a temperature of the IC device is below the minimum operating temperature, and power off when the temperature of the IC device is above the minimum operating temperature, and the heat exchanger is configured to: conduct heat from the heating element to the IC device when the heating element is powered on, such that the temperature of the IC device is increased, and conduct heat away from the IC device when the IC device is powered on such that the temperature of the IC device is maintained or decreased.

Example 2 provides the apparatus of example 1, in which the apparatus is configured to be thermally coupled to the IC device by thermally conductive material (e.g., 112).

Example 3 provides the apparatus of any one of examples 1-2, in which the temperature of the IC device is sensed by a temperature sensor (e.g., 122).

Example 4 provides the apparatus of any one of examples 1-3, in which the minimum operating temperature is 0° C.

Example 5 provides the apparatus of any one of examples 1-4, further comprising (e.g., FIG. 10) a power source (e.g., 1004) conductively coupled to the heating element.

Example 6 provides the apparatus of example 5, in which: the power source comprises a battery of a vehicle (e.g., 1202), and the battery is configured to provide power to other components inside the vehicle.

Example 7 provides the apparatus of any one of examples 1-6, further comprising a comparator (e.g., 1002) coupled to the apparatus, in which the comparator is configured to:

receive signals indicative of the temperature of the IC device from a temperature sensor, determine whether the temperature is below the minimum operating temperature, and power on the heating element based on a determination that the temperature is below the minimum operating temperature.

Example 8 provides the apparatus of example 7, in which the comparator is part of a microcontroller.

Example 9 provides the apparatus of any one of examples 1-8, in which the IC device is configured to not power on when a temperature of the IC device is below the minimum operating temperature.

Example 10 provides the apparatus of any one of examples 1-9, in which the IC device is a microprocessor.

Example 11 provides the apparatus of any one of examples 1-10, in which the heating element comprises at least one of (e.g., FIG. 5): a flexible heater, a cartridge heater, and a coil heater.

Example 12 provides the apparatus of any one of examples 1-11, in which the heat exchanger comprises at least one of (e.g., FIGS. 6-8): heat pipes, vapor chamber, and thermally conductive metal.

Example 13 provides the apparatus of example 12, in which the thermally conductive metal comprises at least one of copper and aluminum.

Example 14 provides the apparatus of any one of examples 1-13, in which the IC device is attached to a motherboard (e.g., 114).

Example 15 provides the apparatus of example 14, in which a temperature sensor on the motherboard senses at least one of ambient temperature and a temperature of the IC device.

Example 16 provides the apparatus of any one of examples 1-14, further comprising a cold-plate (e.g., 116) in thermal contact with the heat exchanger by thermally conductive material (e.g., 118).

Example 17 provides the apparatus of example 16, in which the cold-plate comprises pipes (e.g., 120) for circulating a coolant fluid.

Example 18 provides the apparatus of example 17, in which the coolant fluid is a liquid comprising glycol and water.

Example 19 provides the apparatus of any one of examples 1-18, in which: the IC device is configured to operate between the minimum operating temperature and a maximum operating temperature, and the apparatus is configured to maintain the temperature of the IC device between the minimum operating temperature and the maximum operating temperature.

Example 20 provides the apparatus of example 19, in which the heat exchanger is configured to conduct heat away from the IC device when at least two of the following are true: (1) the heating element is powered off, (2) the IC device is powered on, and (3) the IC device is generating heat.

Example 21 provides a system (e.g., 100), comprising: a PCB (e.g., 114); an IC device (e.g., 110) attached to the PCB; a hybrid heat spreader (e.g., 102) in thermal contact with the IC device such that the IC device is between the hybrid heat spreader and the PCB; a cold-plate (e.g., 116) in thermal contact with the hybrid heat spreader such that the hybrid heat spreader is between the IC device and the cold-plate; a temperature sensor (e.g., 122); a comparator (e.g., 1002); and a power source (e.g., 1004) conductively coupled to the hybrid heat spreader, in which: IC device is configured to operate above a minimum operating temperature, the hybrid heat spreader is configured to heat the IC device when a temperature of the IC device is below the minimum operating temperature, and the hybrid heat spreader is further configured to cool the IC device when the temperature of the IC device is above the minimum operating temperature.

Example 22 provides the system of example 21, in which the hybrid heat spreader is in thermal contact with the IC device through a thermally conductive material (e.g., 112).

Example 23 provides the system of any one of examples 21-22, in which the cold-plate is in thermal contact with the hybrid heat spreader through a thermally conductive material (e.g., 118).

Example 24 provides the system of any one of examples 21-23, in which a size of the heat spreader corresponds to a size of the IC device.

Example 25 provides the system of any one of examples 21-24, in which the cold-plate is configured to maintain a temperature of the IC device between the minimum operating temperature and the maximum operating temperature.

Example 26 provides the system of example 21, in which the hybrid heat spreader comprises: a heating element; and a heat exchanger.

Example 27 provides the system of example 26, in which the comparator is configured to control delivery of power from the power source to the hybrid heat spreader such that: when a temperature of the IC device is below the minimum operating temperature, power is delivered from the power source to the heating element, and when the temperature of the IC device is above the minimum operating temperature, power is not delivered from the power source to the heating element.

Example 28 provides the system of example 26, in which: when a temperature of the IC device is below the minimum operating temperature, the heating element is powered on, and the heat exchanger is configured to conduct heat from the heating element to the IC device, and when the temperature of the IC device is above the minimum operating temperature, the heating element is powered off, and the heat exchanger is configured to conduct heat from the IC device to the cold-plate.

Example 29 provides the system of example 21, in which the cold-plate comprises pipes through which coolant fluid is configured to be pumped when the IC device is powered on.

Example 30 provides the system of example 21, further comprising a plurality of IC devices and a corresponding plurality of hybrid heat spreaders thermally coupled to the respective IC devices.

Example 31 provides a method for operating a hybrid heat spreader inside a vehicle, comprising: providing an IC device attached to a PCB, in which: the hybrid heat spreader is between the IC device and a cold-plate configured to transfer heat from the IC device, and the hybrid heat spreader comprises a heating element and a heat exchanger; providing one or more temperature sensors; receiving, at a comparator, a first signal from at least one temperature sensor, the first signal based on a temperature measured by the at least one temperature sensor; determining, by the comparator, whether the first signal is less than a reference signal, the reference signal corresponding to a minimum operating temperature of the IC device; if the first signal is less than the reference signal, generating, by the comparator, a second signal to power on the heating element; and if the first signal is greater than the reference signal, generating, by the comparator, a third signal to power off the heating element.

Example 32 provides the method of example 31, further comprising: determining whether the IC device is powered on; and if the IC device is powered on, powering off the heating element.

Example 33 provides the method of example 31, further comprising pumping coolant through pipes in the cold-plate, in which the coolant transfers heat generated by the IC device.

Example 34 provides the method of example 31, wherein the coolant is a mixture of glycol and water.

Example 35 provides the method of example 34, in which the coolant is part of a cooling system of the vehicle.

Example 36 provides the method of example 31, in which: the heat exchanger transfers heat from the heating element to the IC device when the heating element is powered on, and the heat exchanger transfers heat from the IC device to the cold-plate when the IC device is generating heat.

Example 37 provides the method of example 31, in which the comparator is part of a microcontroller.

Example 38 provides the method of example 31, in which the heating element comprises at least one of (e.g., FIG. 5): a flexible heater, a cartridge heater, and a coil heater.

Example 39 provides the method of example 31, in which the heat exchanger comprises at least one of: heat pipes, vapor chamber, and thermally conductive metal.

Example 40 provides the method of example 31, in which the IC device is part of a computing device of the vehicle.

Example 41 provides the method of example 31, further comprising: providing an IC device attached to a PCB, in which: the hybrid heat spreader is between the IC device and a cold-plate, the cold-plate configured to transfer heat from the IC device, and the hybrid heat spreader comprises a heating element and a heat exchanger; and providing one or more temperature sensors.

The various examples described above are provided by way of illustration only and should not be construed to limit the scope of the disclosure. For example, the principles herein apply equally to optimization as well as general improvements. Various modifications and changes may be made to the principles described herein without following the example examples and applications illustrated and described herein, and without departing from the spirit and scope of the disclosure. Claim language reciting "at least one of" a set indicates that one member of the set or multiple members of the set satisfy the claim.

What is claimed is:

1. An apparatus, comprising:
a heating element; and
a heat exchanger proximate to the heating element, wherein:
the apparatus is configured to be thermally coupled to an integrated circuit (IC) device,
the IC device is configured to operate above a minimum operating temperature,
the heating element is configured to:
power on when a temperature of the IC device is below the minimum operating temperature, and
power off when the temperature of the IC device is above the minimum operating temperature, and
the heat exchanger is configured to:
conduct heat from the heating element to the IC device when the heating element is powered on, such that the temperature of the IC device is increased, and
conduct heat away from the IC device when the IC device is powered on, such that the temperature of the IC device is maintained or decreased.

2. The apparatus of claim 1, further comprising a comparator coupled to the apparatus, wherein the comparator is configured to:
receive signals indicative of the temperature of the IC device from a temperature sensor,
determine whether the temperature is below the minimum operating temperature, and
power on the heating element based on a determination that the temperature is below the minimum operating temperature.

3. The apparatus of claim 1, wherein the heating element comprises at least one of: a flexible heater, a cartridge heater, and a coil heater.

4. The apparatus of claim 1, wherein the heat exchanger comprises at least one of: heat pipes, vapor chamber, and thermally conductive metal.

5. The apparatus of claim 1, wherein:
the IC device is configured to operate between the minimum operating temperature and a maximum operating temperature, and
the apparatus is configured to maintain the temperature of the IC device between the minimum operating temperature and the maximum operating temperature.

6. The apparatus of claim 5, wherein the heat exchanger is configured to conduct heat away from the IC device when at least two of the following are true: (1) the heating element is powered off, (2) the IC device is powered on, and (3) the IC device is generating heat.

7. The apparatus of claim 1, further comprising a power source conductively coupled to the heating element.

8. The apparatus of claim 7, wherein:
the power source comprises a battery of a vehicle, and
the battery is configured to provide power to other components inside the vehicle.

* * * * *